United States Patent [19]
Barrett et al.

[11] Patent Number: 5,243,599
[45] Date of Patent: Sep. 7, 1993

[54] TREE-TYPE MULTIPLEXERS AND METHODS FOR CONFIGURING THE SAME

[75] Inventors: Stephen B. Barrett, Williston; Clarence R. Ogilvie, Huntington, both of Vt.

[73] Assignee: International Business Machines Corporation, Armonk, N.Y.

[21] Appl. No.: 710,623

[22] Filed: Jun. 5, 1991

[51] Int. Cl.[5] ............ H04J 3/04; H03K 17/56
[52] U.S. Cl. .................... 370/112; 307/243; 307/244; 328/153; 328/154
[58] Field of Search ........... 370/94.1, 112; 307/243, 307/244; 328/153, 154, 105

[56] References Cited

U.S. PATENT DOCUMENTS

| | | | |
|---|---|---|---|
| 3,614,327 | 10/1971 | Low et al. | 370/112 |
| 3,654,394 | 4/1972 | Gordon | 370/113 |
| 3,924,079 | 12/1975 | Garrett | 370/112 |
| 4,017,687 | 4/1977 | Hartzler et al. | 370/6 |
| 4,093,823 | 6/1978 | Chu | 370/94.1 |
| 4,504,943 | 3/1985 | Nagano et al. | 370/112 |
| 4,821,034 | 4/1989 | Anderson et al. | 340/825.8 |
| 4,825,105 | 4/1989 | Holzle | 307/243 |
| 4,839,847 | 6/1989 | Laprade | 364/754 |
| 4,912,339 | 3/1990 | Bechade et al. | 307/243 |

OTHER PUBLICATIONS

Ogilive et al., "CMOS Self-Decoding Complementary Pass Gate Multiplexer", IBM Technical Disclosure Bulletin, vol. 28, No. 3, pp. 1302-1303, Oct. 1985.

*Primary Examiner*—Douglas W. Olms
*Assistant Examiner*—Ajit Patel
*Attorney, Agent, or Firm*—Heslin & Rothenberg

[57] ABSTRACT

N stage tree-type mutliplexers having multiple selects and associated processes for configuring the same are disclosed. The basic multiplexer has control signals which are disbursed throughout the tree for high performance multiplexing. Control signals are distributed such that different signals control at least one stage of the N stage tree and such that the signals controlling the selectors in each of the plurality of selector paths from the input stage to the output stage of the tree are unique. As an enhancement, circuitry for buffering the control signals provided to the input stage of the tree can be used to further reduce the capacitive load thereon.

24 Claims, 6 Drawing Sheets

TREE-TYPE MULTIPLEXERS AND METHODS FOR CONFIGURING THE SAME

BACKGROUND OF THE INVENTION

1. Technical Field

This invention relates in general to multiplexer circuits and, more particularly, to tree-type multiplexers having multiple selects wherein selector control signals are dispersed for high performance multiplexing, and to associated processes for configuring such multiplexers.

2. Description of the Prior Art

Multiplexers of different type are known in the art. One specific type of multiplexer is a tree arrangement such as disclosed in several earlier U.S. patents, e.g., U.S. Pat. No. 3,614,327, entitled "Data Multiplexer Using Tree Switching Configuration," and U.S. Pat. No. 3,654,394, entitled "Field Effect Transistor Switch, Particularly for Multiplexing." Another tree approach to multiplexing is to combine multiple data selects (such as the one of two select depicted in FIG. 1, having the logical function set forth in FIG. 2) in a layered configuration such as that depicted in FIG. 3. The multiplexer of FIG. 3 comprises a decoder wherein a particular data input from the thirty-two inputs $X_0 14 X_{31}$ is selected for output on line R by the signals appearing on control lines $A_0$–$A_4$. This type of multiplexer has a significant advantage over other multiplex implementations in that the control lines $A_0$–$A_4$ are much closer (in terms of logic depth) to the output and, therefore, provide a faster control path than other types of decode devices, such as a conventional AND function with decode control logic to drive the inputs. The AND function with decode control logic approach places loads on the control lines at a rate proportional to the number of data being selected.

The inherent drawback to tree-type multiplexing is that the approach also suffers from heavy loading conditions on the control lines. Loading within such structures typically increases at a rate proportional to the number of input data being selected. For example, in FIG. 3, control line $A_0$ is loaded with one data selector(s), line $A_1$ with two data selectors, line $A_2$ with four data selectors, line $A_3$ with eight data selectors, and line $A_4$ with sixteen data selectors. This significantly higher load on control line $A_4$ limits performance of the circuit. The disadvantage becomes more pronounced as the number of stages of multiplexed data selects increases, such as typically encountered with RAMs and ROMs. The present invention is designed to address this loading problem inherent in existing tree-type multiplexers.

SUMMARY OF THE INVENTION

Briefly summarized, a method and structure for reducing peak loading on the control signals of an N stage tree-type multiplexer are provided. The tree-type multiplexer has an input stage, an output stage and a plurality of data flow selector paths therebetween. In a basic embodiment, the method includes the steps of: distributing the control signals such that different signals control at least one stage of the N stage tree and such that the signals controlling the selectors in each of the plurality of selector paths from the input stage to the output stage are unique; and identifying data inputs to the first input stage of the N stage tree-type multiplexer using the distributed control signals.

In another basic embodiment, the invention comprises a method for fabricating a multiplexer from a plurality of selects. Each select has at least two data inputs, a control signal input and an output. The fabrication method includes connecting the multiple selects in a tree-type configuration of N layered stages. The selects are interconnected such that the output of each select in stage i is fed to an input of a select in stage i+1, wherein i=1...N−1. Further, stage i=1 of the configuration comprises an input stage and stage i=N of the configuration comprises an output stage. A plurality of selector paths are defined by the interconnected selects between the input stage and the output stage. The method further includes distributing control signals to the tree-type configuration such that different signals control at least one stage of the N stages and such that the signals controlling the selectors in each path for each of the plurality of selector paths from the input stage to the output stage are unique.

In a more specific embodiment, the method includes the steps of: partitioning the tree-type multiplexer into multiple sections; assigning from a plurality of multiplexer control signals an arbitrary control signal to control the output stage of the tree; assigning a unique control signal to each partitioned section in the input stage of the tree such that each of the unique control signals is different from the signal arbitrarily assigned to the output stage; and assigning a control signal to each section in the remaining stage of the N stage tree-type multiplexer such that the control signals assigned in each selector path of the tree are unique from input to output. As an enhanced processing step, the method can include identifying specific data inputs at the input stage of the multiplexer using the assigned control signals. In addition, control signal loading can be further reduced by buffering the unique control signals supplied to the input stage of the tree for subsequent application to the stages between the input stage and the output stage. The buffering delay of input stage control signals is commensurate with the delay through the selectors of the first stage in order that the control signals for the second stage through stage N−1 arrive at the appropriate selectors while the input data is being passed therethrough.

In yet another aspect, the invention comprises a novel tree-type multiplexer structure. The structure has a plurality of selects distributed in N interconnected stages. The interconnected stages form a pyramid structure which has an input stage, an output stage and a plurality of data flow selector paths therebetween. The input stage has a plurality of data inputs. A plurality of control lines are connected to the selectors such that at least one stage of the N stages is controlled by different control lines and such that each control line controlling the selectors in each of the plurality of selector paths between the input stage and the output stage are unique. As an enhancement, buffers can be provided to further reduce the loading on the plurality of control lines by duplicating each of the unique control signals applied to the input stage of the tree which can then be used to control subsequent selector stages.

The tree-type multiplexer and methods of fabrication disclosed herein define a structure which significantly improves upon the performance of conventional tree-type multiplexers, without changing the logical characteristics thereof. Improved performance is obtained by reducing the capacitive loads on the control logic through various signal distribution techniques. The multiplexer and fabrication methods can be used in any circuitry where high performance multiplexing is required, including data flow elements, RAMs, ROMs and/or control logic.

BRIEF DESCRIPTION OF THE DRAWINGS

These and other objects, advantages and features of the present invention will be more readily understood from the following detailed description of certain preferred embodiments thereof, when considered in conjunction with the accompanying drawings in which.

DETAILED DESCRIPTION OF THE INVENTION

Broadly stated, the present invention comprises a tree-type multiplexer and associated methods of implementation in which peak loading on the control signals to the multiplexer are reduced such that no one signal experiences a significantly greater capacitive load than other signals. Along with distributing the load, the data inputs to the tree-type multiplexer can be reassigned using the distributed control signals. One specific technique for implementing the tree-type multiplexer of the present invention is set forth in the flowchart of FIG. 4.

Pursuant to this detailed example, the first step is to partition the tree into P sections, 20 "Partition the Tree." The variable P is defined as an integer which is the maximum power of two which is less than or equal to N−1 (wherein N=the number of control signals or address lines). Using this criteria, a table such as Table 1 can be created to identify the number of partition sections required for various numbers of control signals.

TABLE 1

| N Control lines | P Sections |
|---|---|
| 2 | 1 |
| 3 | 2 |
| 4 | 2 |
| 5 | 4 |
| 6 | 4 |
| 7 | 4 |
| 8 | 4 |
| 9 | 8 |
| 10 | 8 |
| 11 | 8 |
| 12 | 8 |

TABLE 1-continued

| N Control lines | P Sections |
|---|---|
| 13 | 8 |
| 14 | 8 |
| 15 | 8 |
| 16 | 8 |
| 17 | 16 |
| . | . |
| . | . |
| . | . |

Figures 1, 2:
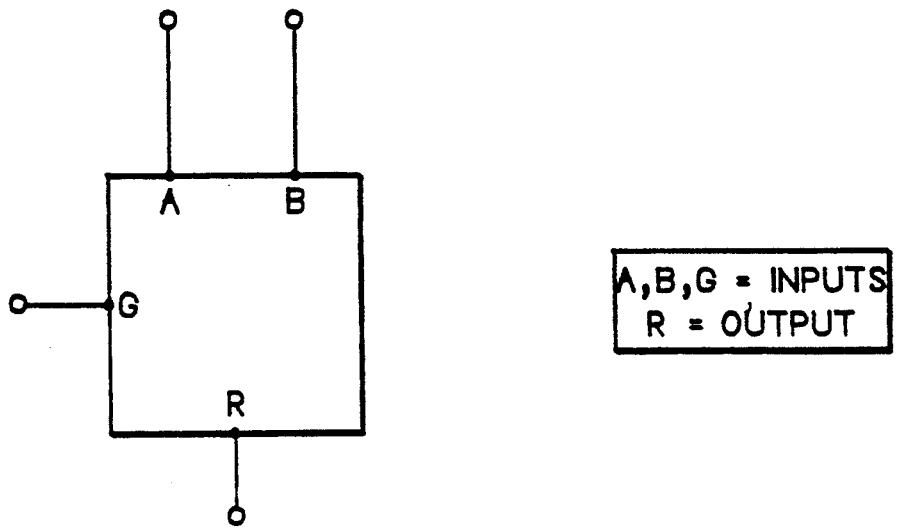
FIG. 1 depicts a one of two select used in a tree-type multiplexer configuration in accordance with the present invention.
FIG. 2 is a table of the logic function of the one of two select of FIG. 1.
Figure 3:
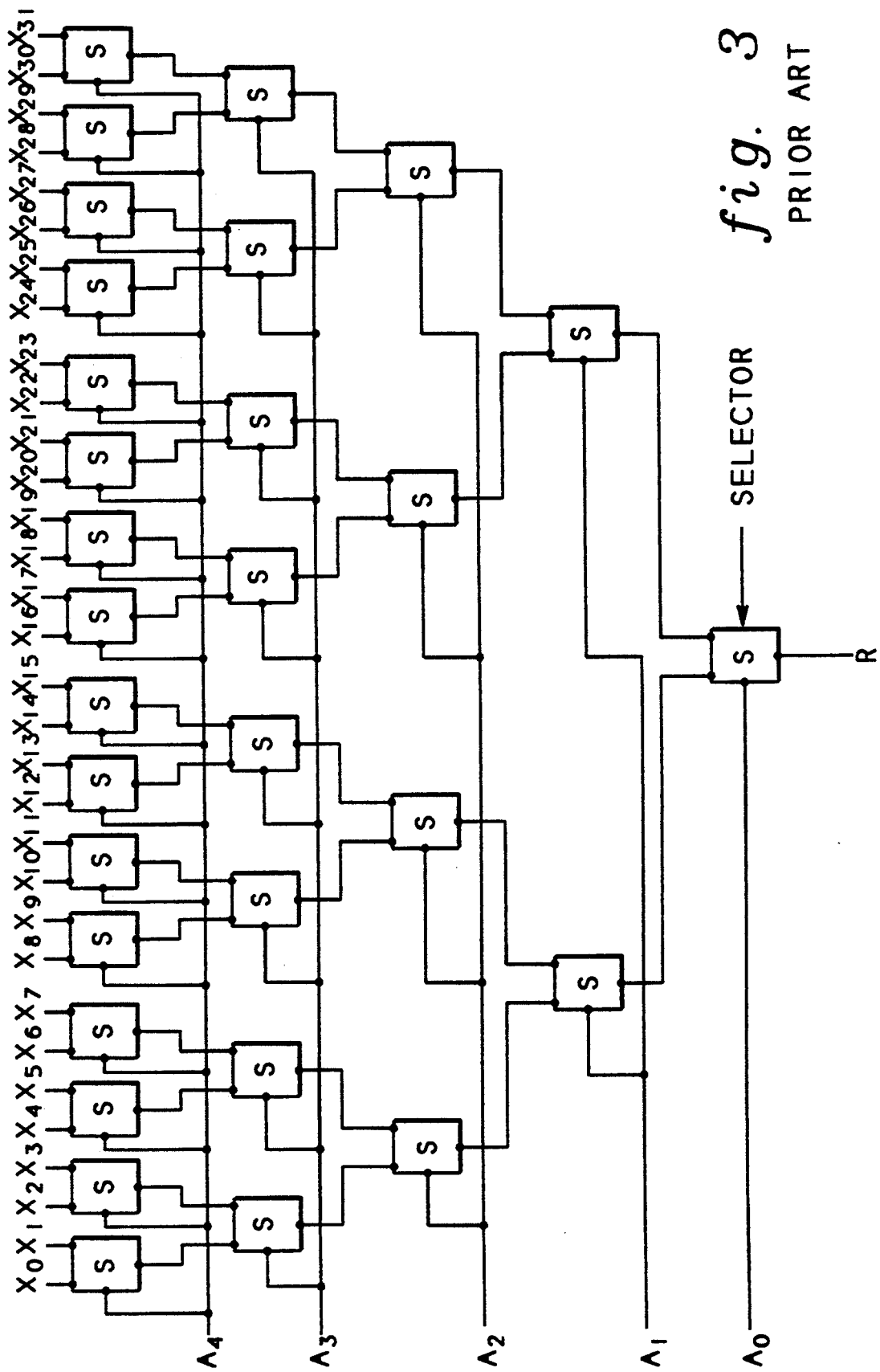
FIG. 3 is a schematic of a prior art example of a tree-type multiplexer using the select of FIG. 1.
Figure 5:
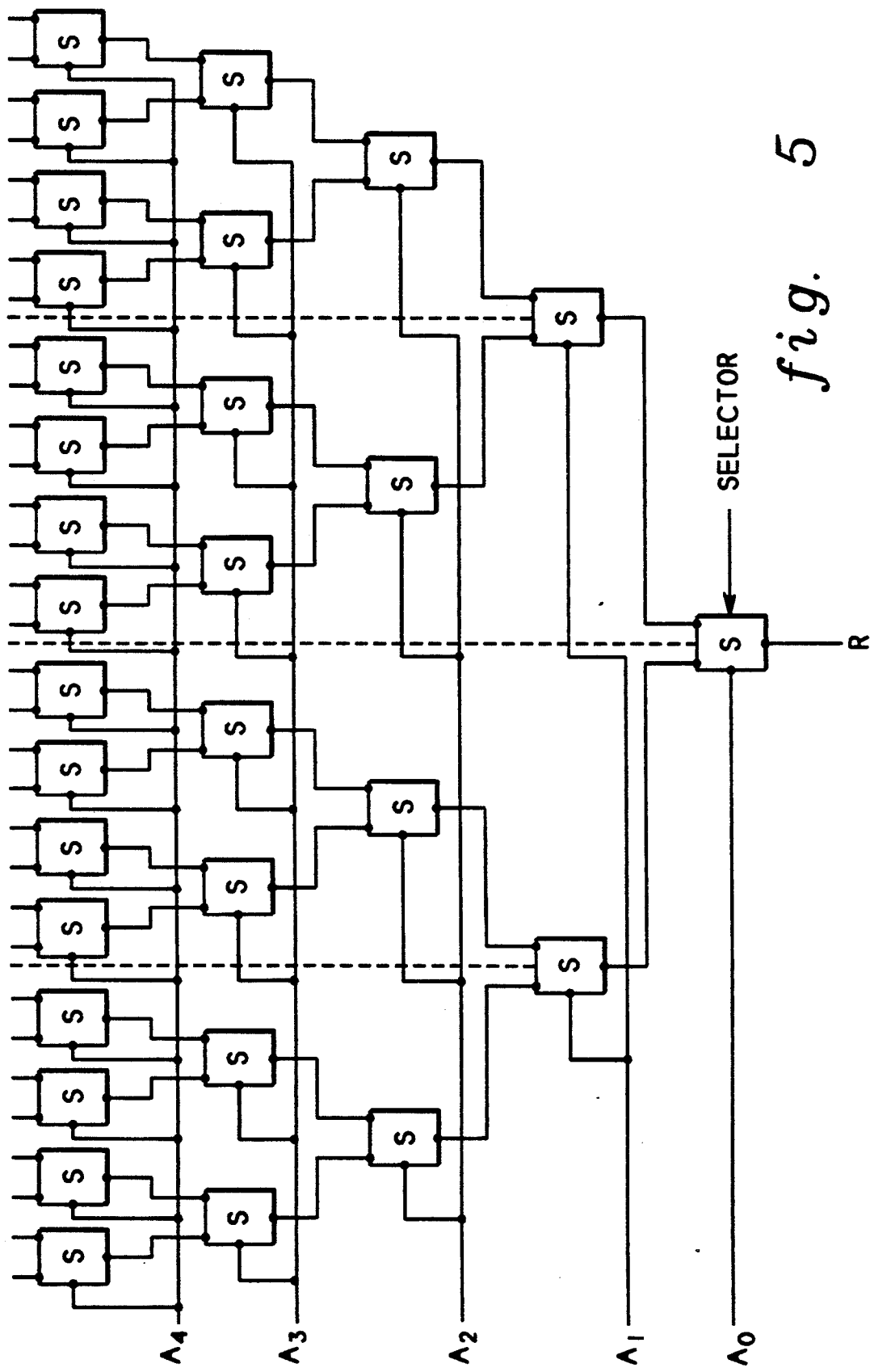
FIG. 5 is a schematic of a tree-type multiplexer containing one of two selects partitioned into sections in accordance with one embodiment of the present invention.

By way of example, since the multiplexer of FIG. 3 has five control lines $A_0$–$A_4$, the tree is partitioned into four sections by the criteria of step 20. An appropriately partitioned multiplexer is depicted in FIG. 5 wherein phantom lines represent partition lines. In the example provided, partitioning to arrive at the desired number of sections is accomplished by repeatedly dividing from input to output subsequent sections of the tree in half (as shown in FIG. 5). In an alternate embodiment, partitioning can be accomplished separately for each stage of the tree, for example, when control signals are to be assigned to the selectors thereof.

Next, a control signal is assigned to the Nth control stage, 22 "Assign Control Signal to Control Stage N." The tree has a pyramid structure such that control stages narrow from an input stage (stage 1) to an output stage (stage N), which in the example depicted is stage 5. The control signal assigned to control stage N is arbitrary, and can comprise any one of signals $A_0$–$A_4$.

The third step is to arbitrarily assign from the remaining group of control signals a unique control signal to each partitioned section of stage 1, 24 "Assign Control Signals to Control Stage 1." In other words, the control signals are assigned to the various stage 1 sections such that no data flow path from the input stage to the output stage of the tree uses the same control signal to control more than one selector(s).

After instruction 24, an index value "i" is assigned the number 2, which represents the second control stage, 26 "i=2." Thereafter, control signals are arbitrarily assigned to each partitioned section of control stage "i", again such that no path in the tree from the input stage to the output stage uses the same address line as a control more than once, 28 "Assign Control Signals to Control Stage i." Inquiry is then made whether control stage "i" comprises the stage N−1 in the tree such that all stages have been assigned control signals, 30 "i=N−1? (All Stages Assigned?)." If "no", value "i" is incremented, 32 "i=i+1," and return is made to junction 27 and hence instruction 28 wherein control signals are assigned to the new, incremented stage.

If all control stages have been assigned a control signal, then from inquiry 30 the method requires that an index value "j", representative of the data input, be indexed to zero (i.e., $X_0$), 34 "j=0," after which the location of data input "j" is assigned based on the control signals which have been distributed throughout the multiplexer, 36 "Assign Data Input j." Thereafter, inquiry is made whether all data inputs have been assigned, 38 "j=Q−1? (All Inputs Assigned?)". Assuming that all data inputs have not been assigned, index "j" is incremented, 40 "j=j+1," and return is made to junction 35 and hence instruction 36 where the next data input is assigned.

Figure 6:
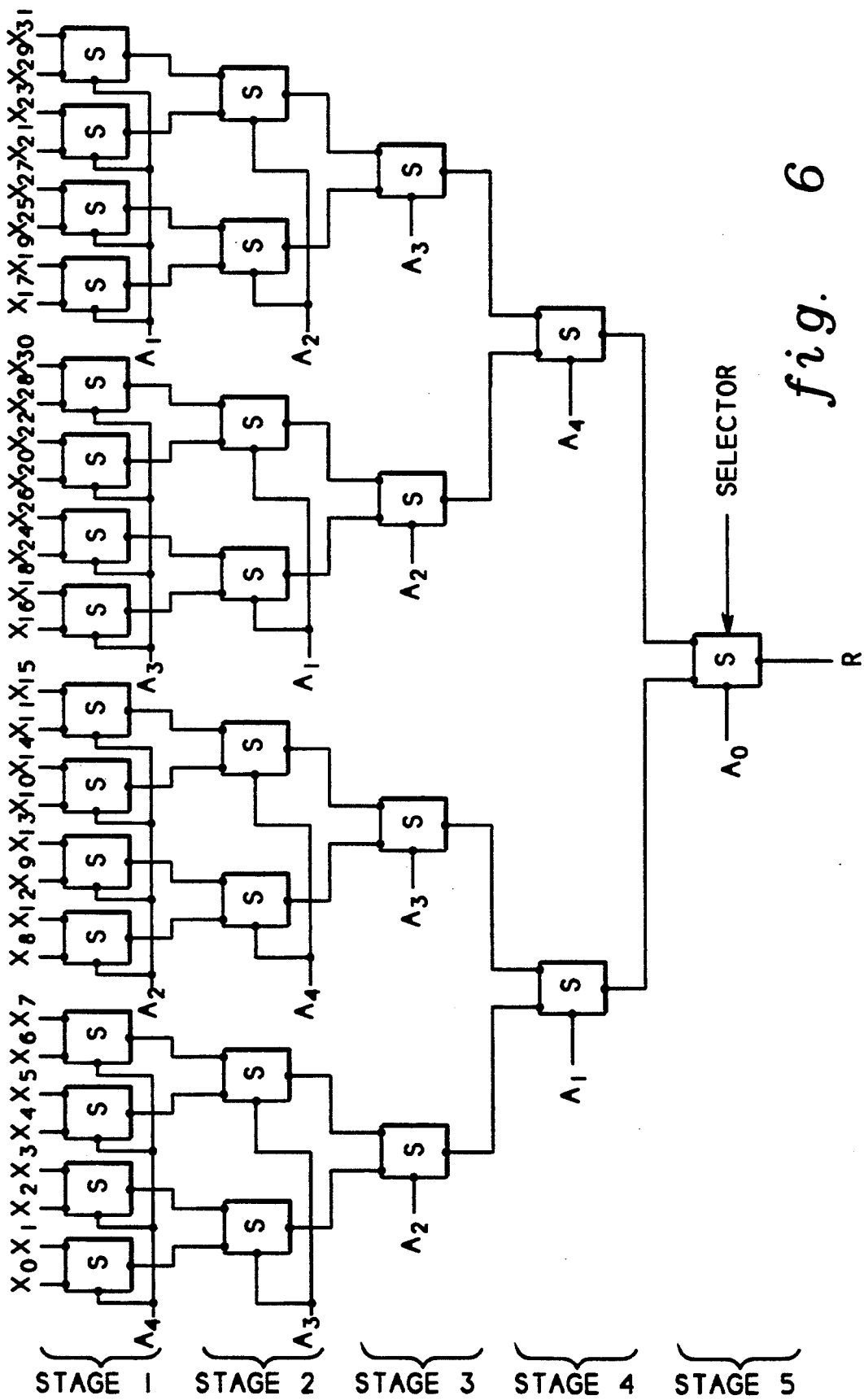
FIG. 6 is a schematic of a tree-type multiplexer containing one of two selects wherein control signals are distributed through the tree and input data is assigned based thereon, all in accordance with the present invention.

Again, assigning a data input involves ascertaining an input location using the value of the control signals for the selected data input and the distributed tree. For example, FIG. 6 depicts a distributed tree structure wherein input $X_{17}$ is conventionally selected in binary with control signals $A_0$–$A_4$ equal to 10001. The input is identified by tracing a sensitized path from the output stage to the unique input of the input stage associated with this setting of the control signals. The same process continues until all data inputs have been assigned. Once the inputs are assigned, the distribution method has been completed and processing is terminated, 42 "End."

Figure 4:
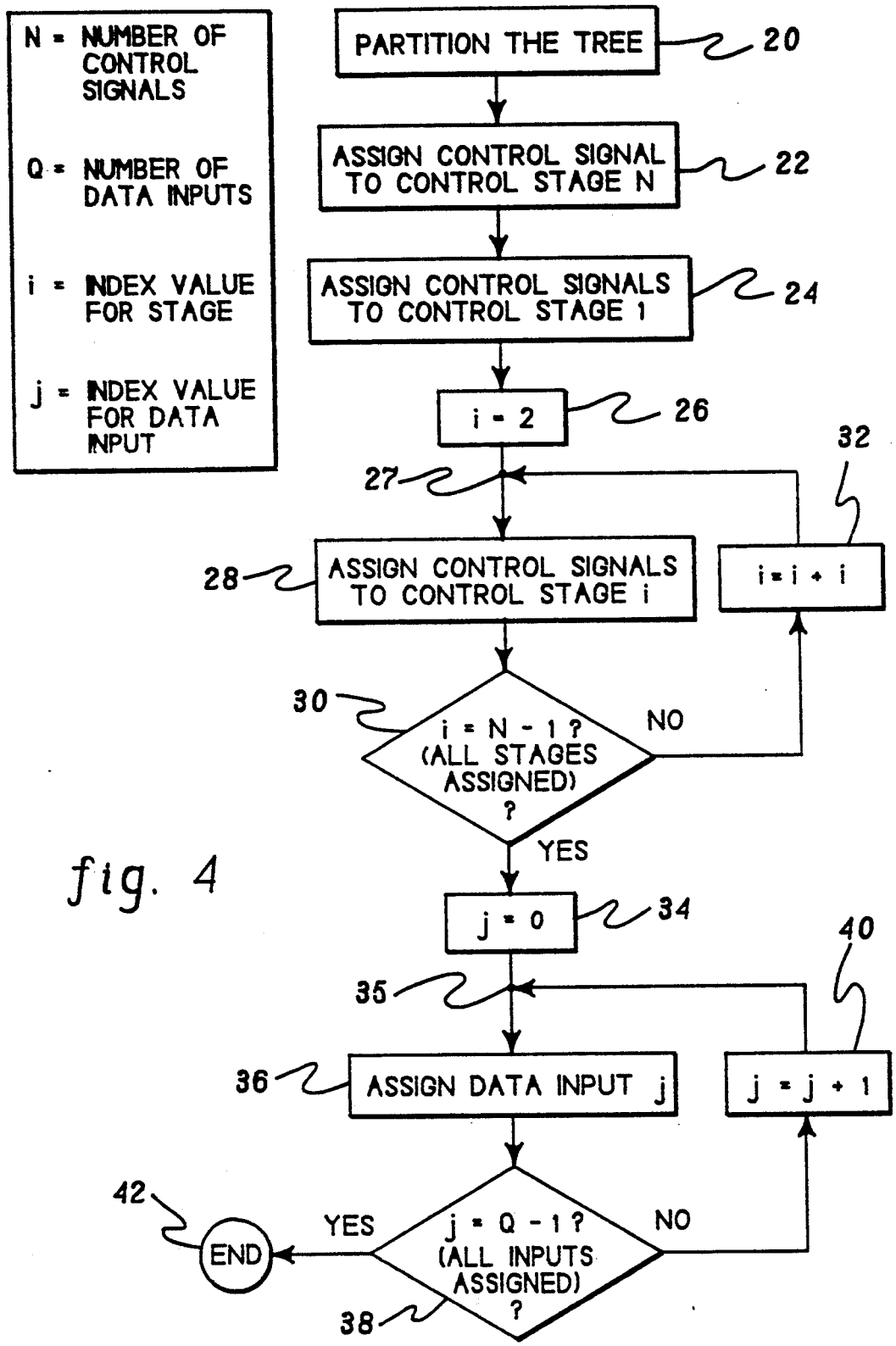
FIG. 4 is a flowchart of one processing embodiment of the present invention.

By way of more detailed process explanation, step 1 of the flowchart of FIG. 4 requires that the tree be partitioned into P sections. Using the tree of FIGS. 5 & 6 as an example, since there are five control signals ($A_0$–$A_4$) the partition formula dictates that four partition sections be created in the tree (FIG. 5). Next, the Nth control stage, stage 5, is arbitrarily assigned control signal $A_0$. Thereafter, signals for the uppermost control stage, stage 1, are arbitrarily assigned from the remaining signals such that each partitioned section is assigned a unique control signal (FIG. 6). The control signals are arbitrarily chosen as $A_4$, $A_2$, $A_3$, and $A_1$ for the left to right partition sections, respectively. According to the process, signal $A_0$ may not be used as a stage 1 section control since it has already been assigned to the Nth stage of the tree and, therefore, is already associated with every data flow path of the tree from the input stage to the output stage.

Control signals for the remaining control stages of the tree are then assigned, again such that no control signal influences more than one circuit in any input to output path of the tree. This allows signal $A_1$ or $A_3$ to be chosen for the leftmost selector and signal $A_2$ or $A_4$ to be chosen for the rightmost selector in stage 4. Signals $A_1$ and $A_4$ are arbitrarily chosen in the example of FIG. 6. The process similarly repeats for stage 3 and stage 2, again such that no control signal influences more than one selector in a path of the tree. Note that this criterion leaves no choice with respect to the assignment of control signals to the last stage in the logic tree. Also, note that the order of assigning control signals to the stages subsequent assignment of stage N and stage 1 is immaterial.

The last step in the process is to identify data inputs with specific input terminals using the distributed tree. For example, data input $X_{28}$ is represented in binary as 11100 such that the control signals are $A_0 = 1$, $A_1 = 1$, $A_2 = 1$, $A_3 = 0$ & $A_4 = 0$. Following this control sequence, the particular input for $X_{28}$ can be identified as the input location depicted in FIG. 6. Specifically, since $A_0 = 1$, the right input to the select of stage 5 is sensitized; for $A_4 = 0$, the left input of the corresponding select in stage 4 is sensitized; for $A_2 = 1$, the right input to the corresponding select in stage 3 is sensitized; for $A_1 = 1$, the right input to the corresponding select in stage 2 is sensitized; and, finally, $A_3 = 0$, such that the left input to the corresponding select of stage 1 is sensitized. This input is thus identified as circuit input $X_{28}$. The remaining data inputs are assigned in a similar manner.

A comparison of the capacitive loading on each control signal in the prior art tree of FIG. 3 and the distributed tree of FIG. 6 (configured pursuant to the present invention) is provided in Table 2.

TABLE 2

| Address Line | FIG. 3 Tree | FIG. 6 Tree |
|---|---|---|
| $A_0$ | 1 | 1 |
| $A_1$ | 2 | 7 |
| $A_2$ | 4 | 8 |
| $A_3$ | 8 | 8 |
| $A_4$ | 16 | 7 |

As indicated, the high loading on line $A_4$ in the prior art tree configuration is eliminated by the distribution of control signals such as in the tree of FIG. 6. Although the FIG. 6 and FIG. 3 tree embodiments have the same logic characteristics, performance of the FIG. 6 tree is significantly better owing to the distribution of control signals (which are in the critical path for improving performance of the multiplexer). As shown in FIG. 3, the maximum load on the control lines is the load on $A_4$, which has a fan-out load of 16 drops. This heavy load on the control line farthest from the output of the circuit is the primary delay limiting the performance of the multiplexer. In comparison, the distributed tree of FIG. 6 has a load on any address line equal to a maximum of 8 such that the technique described herein gains on the order of 30 percent performance improvement in thirty-two bit multiplexers. Even greater improvement is anticipated with more complex structures. Again, the technique can be used on any tree-type logic design. (Also, those skilled in the art will recognize that the process concepts outlined herein are readily implementable in software.)

Figure 7:
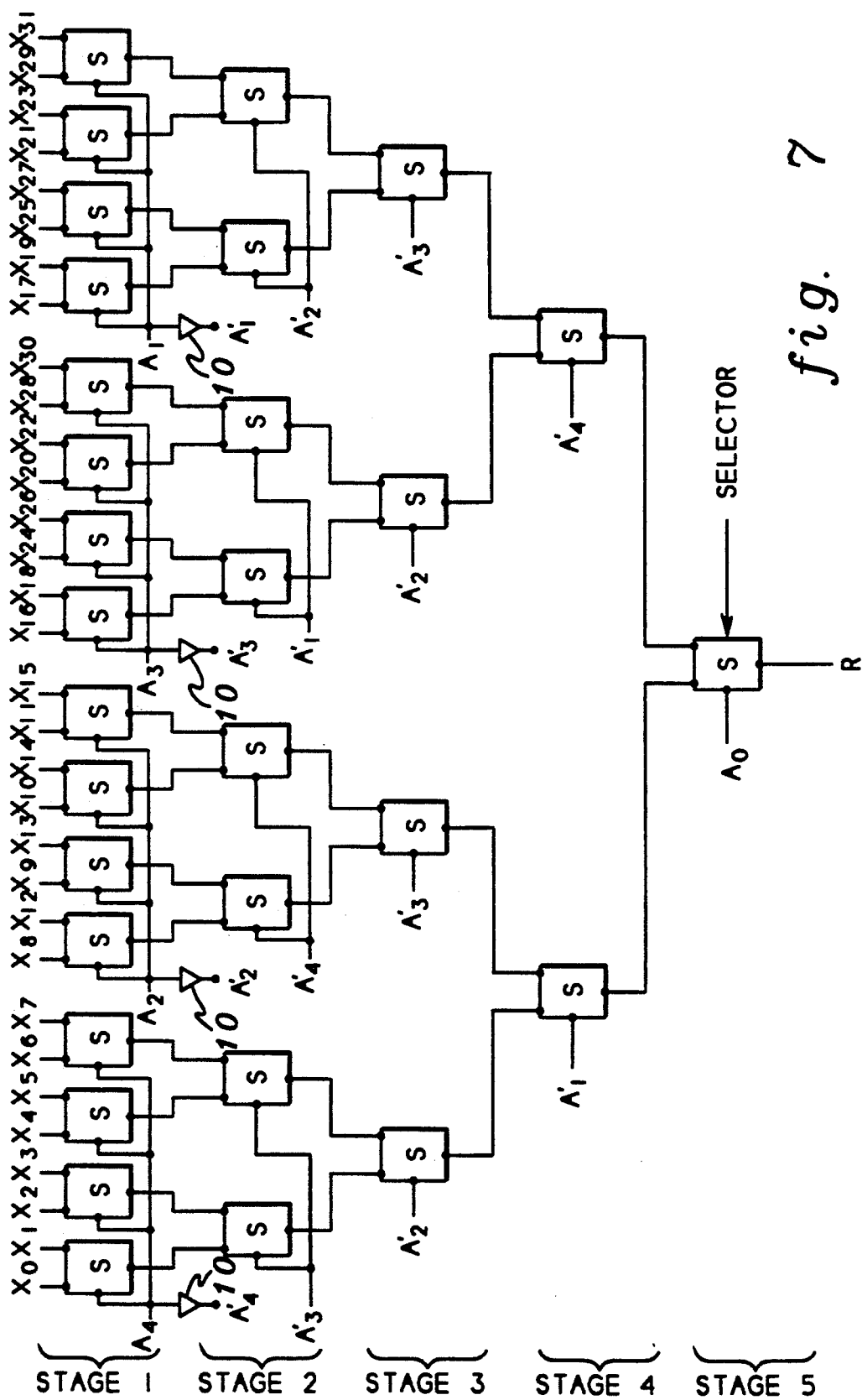
FIG. 7 is a schematic of an alternate embodiment of a tree-type multiplexer containing one of two selects having control signals and data inputs distributed in accordance with the present invention.

As a further enhancement, FIG. 7 depicts a tree-type multiplexer having distributed control signals which uses buffers 10 to produce delay control signals for control the selectors of the stages between stage 1 and stage 5 (i.e., stage N). Since control signals $A_4$, $A_2$, $A_3$ & $A_1$ control the selects of stage 1, each of these signals is buffered to produce duplicate signals $A_4'$, $A_2'$, $A_3'$ & $A_1'$, respectively. The buffering is balanced such that each buffer 10 output is timed to coincide with the output from the stage 1 selects. As shown, in stages 2, 3 & 4, control signals $A_3'$, $A_4'$, $A_1'$ & $A_2'$ replace control signals $A_3$, $A_4$, $A_1$ & $A_2$, respectively, of the FIG. 6 tree embodiment. In this case, buffering guarantees that the maximum load on an address line of the multiplexer in any depth for the thirty-two bit example is five. The loading for each control signal is set forth in Table 3.

TABLE 3

| Control Signal | Capacitive Load |
|---|---|
| $A_0$ | 1 |
| $A_1$ | 5 |
| $A_2$ | 5 |
| $A_3$ | 5 |
| $A_4$ | 5 |
| $A_1'$ | 3 |
| $A_2'$ | 4 |
| $A_3'$ | 4 |
| $A_4'$ | 3 |

In will noted from the above description that certain novel tree-type multiplexers and methods of construction are provided herein. Specifically, the multiplexers and methods of distribution described provide significant improvement in performance over conventional tree-type multiplexers, without changing the logical characteristics thereof. Improved performance is obtained by reducing the capacitive loads on the control logic through various control signal distribution techniques. Further, the multiplexers and fabrication methods can be used for any circuitry where high performance multiplexing is required, including data flow elements, RAMs, ROMs and/or control logic circuitry.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for reducing peak loading on control signals of an N stage tree-type multiplexer of N stages having an input stage, an output stage, and a plurality of selector paths therebetween, said method comprising the steps of:
    (a) distributing said control signals such that different control signals control at least one stage of said N stages and such that the control signals controlling selectors in each path for each of the plurality of selector paths from the input stage to the output stage are unique; and
    (b) assigning data inputs to the input stage of the N stage tree-type multiplexer using the control signals as distributed in step (a).

2. The method according to claim 1, wherein said distrusting steps (a) includes distributing selector control signals such that different control signals control each of N−1 stages of said N stage tree-type multiplexer, the output stage of said N stage tree-type multiplexer comprising a single selector and being controlled by a single control signal.

3. The method according to claim 1, wherein said distributing step (a) includes assigning control signals to all selectors within a stage of said N stage tree-type multiplexer, and repeating said control signals assigning for each stage of said N stage tree-type multiplexer.

4. The method according to claim 1, wherein said assigning step (b) includes identifying each of the data inputs to said N stage tree-type multiplexer input stage.

5. The method according to claim 4, wherein said assigning step (b) includes tracing back from the output stage to the input stage of said N stage tree-type multiplexer for each data input using the control signals as distributed in said distributing step (a).

6. A method for fabricating an N stage tree-type multiplexer from a plurality of selectors, each selector having at least two data inputs, a control signal input and an output, said fabrication method comprising the steps of:
    (a) connecting said plurality of selectors in N stage tree-type multiplexer configuration of N stages, said selectors being interconnected such that the output of each selector in stage i is fed to an input of a selector in stage i+1, wherein i=1...N−1 and wherein the i=1 stage of the N stage tree-type multiplexer configuration comprises an input stage and the N stage tree-type multiplexer i=N stage of the configuration comprises an output stage, and wherein said N stage tree-type multiplexer configuration defines a plurality of selector paths between said input stage and said output stage; and
    (b) distributing control signals to the N stage tree-type multiplexer configuration such that different control signals control at least one stage of said N stages and such that the control signals controlling the selectors in each path for each of the plurality of selector paths from the input stage to the output stage are unique.

7. The method according to claim 6, further comprising the step of:
    assigning data inputs to the input stage of the N stage tree-type multiplexer using the control signals distributed in step (b).

8. The method according to claim 6, wherein said distributing step (b) includes distributing selector control signals such that different control signals control each of N−1 stages of said N stage tree-type multiplexer, the output stage of said N stage tree-type multiplexer comprising a single selector and being controlled by a single control signal.

9. The method according to claim 6, wherein said distributing step (b) includes distributing control signals such that different control signals control said input stage.

10. The method according to claim 9, further comprising the step of:
    buffering each of said different control signals assigned to said input stage to produce delay control signals for distribution in subsequent stages; and wherein:
    said distributing step (b) includes distributing each of said delay control signals to at least one selector in a stage subsequent said input stage.

11. A method for distributing a plurality of control signals within an N stage tree-type multiplexer to reduce peak loading thereon, said N stage tree-type multiplexer having an input stage, an output stage and a plurality of selector paths therebetween, said distribution method comprising the steps of:
    (a) partitioning the N stage tree-type multiplexer into multiple sections;
    (b) assigning an arbitrary control signal from said plurality of control signals to control the output stage of the tree;
    (c) assigning a unique control signal to each partitioned section in the input stage of the tree, each unique control signal being different from said control signal arbitrarily assigned in step (b); and
    (d) assigning a control signal to each section in each remaining stage of the N stage tree-type multiplexer such that the control signals assigned in each path of the tree are unique.

12. The method according to claim 11, further comprising the step of:
    assigning data inputs to the input stage of the N stage tree-type multiplexer using the control signals assigned in steps (b)–(d).

13. The method according to claim 12, wherein said data input assigning step includes tracing back from the output stage to the input stage of said N stage tree-type multiplexer for each data input using the distributed control signals.

14. The method according to claim 11, wherein said plurality of control signals comprise N control signals and said partitioning step (a) includes partitioning the N stage tree-type multiplexer into P sections, wherein P is an integer defined as the maximum power of two which is less than or equal to N−1.

15. The method according to claim 14, wherein said partitioning step (a) includes partitioning the N stage tree-type multiplexer into said P sections by repeatedly dividing the N stage tree-type multiplexer structure in half along the direction of data flow from the input stage to the output stage.

16. The method according to claim 11, wherein said assigning step (d) includes assigning a control signal to each section in each remaining stage of the N stage tree-type multiplexer such that different control signals are assigned in same stage for a plurality of stages of said N stage tree-type multiplexer.

17. The method according to claim 11, wherein said plurality of control signals comprises N control signals and wherein said N control signals are each distributed in said assigning steps (b)–(d) within said N stage tree-type multiplexer.

18. The method according to claim 11, further including the steps of:
  buffering each unique control signal assigned to said input stage in said step (c) to produce delay control signals for distribution in subsequent stages; and wherein:
  said assigning step (d) includes assigning said delay control signals to each section in the remaining stages of the N stage tree-type multiplexer such that the control signals assigned in each path of the tree are unique.

19. A method for reducing peak loading on N control signals for an N stage tree-type multiplexer having an input stage, an output stage and a plurality of selector paths therebetween, said method comprising the steps of:
  (a) arbitrarily assigning one of said N control signals to control the output stage of the N stage tree-type multiplexer;
  (b) partitioning the input stage of the tree-type multiplexer into P sections, wherein P comprises an integer equal to the maximum power of two which is less than or equal to N−1;
  (c) assigning a unique control signal to each section of the partitioned input stage, said unique control signal being different from said arbitrarily assigned control signal of step (a);
  (d) partitioning another stage of the N stage tree-type multiplexer into P sections;
  (e) assigning a control signal to each section of the stage partitioned in said step (d), said assigned control signal being unique from any control signal already assigned in the same selector path of the N stage tree-type multiplexer; and
  (f) accomplishing steps (d) & (e) for each stage of the N stage tree-type multiplexer lacking an assigned control signal after said steps (a)–(c).

20. The method according to claim 18, further comprising the step of:
  assigning the data inputs to the N stage tree-type input stage of the multiplexer using the assigned control signal.

21. A N stage tree-type multiplexer comprising:
  a plurality of selectors distributed in N interconnected stages, said interconnected stages forming a pyramid structure having an input stage, an output stage and a plurality of selector paths therebetween, said input stage having a plurality of data inputs;
  a plurality of control lines, each of said control lines being coupled to at least one of said plurality of selectors, and at least one stage of said N stages being controlled by different control lines; and
  wherein control lines controlling the selectors of each path for each of the plurality of selector paths between said input stage and said output stage are each unique within said path.

22. The N stage tree-type multiplexer of claim 21, wherein each of said plurality of selectors comprises one of two selectors.

23. The N stage tree-type multiplexer of claim 21, wherein said plurality of control lines comprises N control lines.

24. The N stage tree-type multiplexer of claim 21, wherein at least some of the selectors of said input stage are controlled by different control lines, and said N stage tree-type multiplexer further comprises multiple buffering means connected to receive said different control lines applied to the selector of said input stage, said buffering means each outputting a delay control signal timed to coincide with data output of said input stage and being connected such that said delay control signal is applied to at least one subsequent stage of said N stages.

* * * * *

UNITED STATES PATENT AND TRADEMARK OFFICE
CERTIFICATE OF CORRECTION

PATENT NO. : 5,243,599
DATED : September 7, 1993
INVENTOR(S) : Stephen B. Barrett, et al.

It is certified that error appears in the above-indentified patent and that said Letters Patent is hereby corrected as shown below:

Column 7, line 29, delete "distrusting steps" and insert --distributing step--.

Column 7, line 53, between "in" and "N" insert --an--.

Column 9, line 27, between "stage" and "and" insert --,--.

Column 9, line 42, between "into" and "P" insert --said--.

Signed and Sealed this

Twentieth Day of September, 1994

BRUCE LEHMAN

*Attest:*

*Attesting Officer*   *Commissioner of Patents and Trademarks*